United States Patent
Chu et al.

(10) Patent No.: US 7,352,032 B1
(45) Date of Patent: Apr. 1, 2008

(54) OUTPUT DRIVER WITH SPLIT PINS

(75) Inventors: Charles Chu, Diamond Bar, CA (US); Marcel ter Beek, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/504,990

(22) Filed: Aug. 16, 2006

(51) Int. Cl.
*H01L 23/62* (2006.01)

(52) U.S. Cl. .............. 257/355; 257/288; 257/107; 257/173

(58) Field of Classification Search ......... 257/336, 257/391, 546, 334, 355, 173, 288, 107; 361/56, 361/100, 51, 111, 91; 437/904
See application file for complete search history.

(56) References Cited

U.S. PATENT DOCUMENTS

| | | | |
|---|---|---|---|
| 5,477,414 A | 12/1995 | Li et al. | 361/56 |
| 5,623,156 A | 4/1997 | Watt | 257/355 |
| 5,623,387 A | 4/1997 | Li et al. | 361/56 |
| 5,689,133 A | 11/1997 | Li et al. | 257/361 |
| 6,529,359 B1 | 3/2003 | Verhaege et al. | 361/100 |
| 6,545,520 B2 | 4/2003 | Maloney et al. | 327/313 |
| 7,110,230 B2 * | 9/2006 | Van Camp et al. | 361/56 |
| 7,119,405 B2 * | 10/2006 | Chen et al. | 257/391 |

* cited by examiner

*Primary Examiner*—Mark A. Robinson
*Assistant Examiner*—Cathy Lam
(74) *Attorney, Agent, or Firm*—Mark C. Pickering

(57) ABSTRACT

The drains of the PMOS transistor and the NMOS transistor of a driver are separated and connected to two spaced-apart pins. The spaced-apart pins provide ESD protection to the NMOS transistor, which can be turned on during an ESD event by voltages that propagate through the PMOS transistor during the ESD event.

20 Claims, 2 Drawing Sheets

A high-voltage driver is an electronic circuit that is used
OUTPUT DRIVER WITH SPLIT PINS

BACKGROUND OF THE INVENTION

1. Field of the Invention

The present invention relates to output drivers and, more particularly, to an output driver with split pins.

2. Description of the Related Art

A high-voltage driver is an electronic circuit that is used in a number of applications. For example, large transistors, which handle hundreds of volts, can be turned on and off with high-voltage drivers. In addition, DC-to-DC converters, such as buck and boost converters, can use high-voltage drivers to provide a switched current source.

FIG. 1 shows a cross-sectional diagram that illustrates a prior-art high-voltage driver 100. As shown in FIG. 1, driver 100 is formed in a semiconductor structure 110 that includes a p-type substrate 112, along with an n− well 114 and a p− well 116 that are formed in p-type substrate 112.

In addition, semiconductor structure 110 includes an n+ contact region 118 that is formed in n− well 114, and a p+ contact region 120 that is formed in p− well 116. N+ contact region 118 is electrically connected to a power line 122 to place a power supply voltage on n− well 114, while p+ contact region 120 is electrically connected to a ground line 124 to place ground on p− well 116. Further, semiconductor structure 110 includes a shallow trench isolation region STI that isolates n− well 114 from p− well 116.

As also shown in FIG. 1, driver 100 includes a PMOS transistor 126 and an NMOS transistor 128. PMOS transistor 126 includes spaced-apart p+ source and drain regions 130 and 132 that are formed in n− well 114, and a channel region 134 that lies between and contacts the source and drain regions 130 and 132. PMOS transistor 126 also includes a layer of gate oxide 136 that contacts the top surface of n− well 114, and a gate 138 that contacts oxide layer 136 and lies over channel region 134.

NMOS transistor 128, in turn, includes spaced-apart n+ source and drain regions 140 and 142 that are formed in p− well 116, and a channel region 144 that lies between and contacts the source and drain regions 140 and 142. NMOS transistor 128 also includes a layer of gate oxide 146 that contacts the top surface of p− well 116, and a gate 148 that contacts oxide layer 146 and lies over channel region 144.

In addition, p+ drain region 132 and n+ drain region 142 are electrically connected together and to an output pin 150. Further, p+ source region 130 is electrically connected to power line 122 to place the power supply voltage on p+ source region 130, while n+ source region 140 is electrically connected to ground line 124 to place ground on source region 140.

In operation, when the voltage on the gates 138 and 148 of transistors 126 and 128 goes high, PMOS transistor 126 turns off while NMOS transistor 128 turns on to sink a current from output pin 150, thereby pulling the voltage on output pin 150 down. On the other hand, when the voltage on the gates 138 and 148 of transistors 126 and 128 goes low, NMOS transistor 128 turns off, while PMOS transistor 126 turns on to source a current to output pin 150, thereby pulling the voltage on output pin 150 up.

One limitation of driver 100 is that driver 100 is susceptible to an electrostatic discharge (ESD) pulse. An ESD pulse, which can occur when a chip is handled prior to being attached to a printed circuit board, momentarily places a very high potential on a pin while the chip is otherwise powered off. If another pin is grounded, a very large current can flow from the high potential pin through circuitry in the chip to the grounded pin. If the pins are not ESD protected, the current can destroy the circuitry in the chip.

Thus, prior to an ESD event, all of the nodes of driver 100 are equal to ground. However, when an ESD event occurs on output pin 150 with respect to pin 124, the voltage on output pin 150 spikes up quickly. This, in turn, causes the voltage on the drain regions 132 and 142 to spike up quickly. When the voltage on drain region 132 spikes up, a parasitic pn diode 152, which is formed from p+ drain region 132 and n− well 114/n+ contact region 118, responds to spike.

Since all of the other nodes of transistor 126 are at ground, the diode becomes forward biased when the voltage on drain region 132 reaches approximately 0.7V. As a result, the voltage on power line 122 spikes up and follows the quickly rising voltage on p+ drain region 132 with a voltage that is approximately 0.7V less than the voltage on p+ drain region 132.

When the voltage on power line 122 spikes up, the voltage on the gates 138 and 148 of the transistors 126 and 128 is quickly pulled up due to a capacitive coupling between power line 122 and the gates 138 and 148. As a result, PMOS transistor 126 turns off, while NMOS transistor 128 turns on and begins to sink an ESD current from drain region 142 and output pin 150 to ground line 124.

However, even though NMOS transistor 128 turns on and sinks the ESD current, the power density is often too great for transistor 128. As a result, the ESD current flowing through NMOS transistor 128 can overheat and destroy NMOS transistor 128. Thus, an ESD event on output pin 150 can lead to the destruction of NMOS transistor 128.

One common approach to providing ESD protection is to connect an ESD clamp, such as a grounded-gate NMOS transistor, between an output pin and ground. To provide ESD protection, a grounded-gate NMOS must provide an open circuit between the output pin and ground during normal operation, and only provide an ESD current path between the output pin and ground when the voltage on the output pin spikes up to a value which is greater than the maximum voltage that can be present during normal operation plus a margin voltage. A grounded-gate NMOS transistor, however, can not provide the needed protection in this situation.

FIG. 2 shows a graph that illustrates an example of the safe operating area of NMOS transistor 128. As shown in FIG. 2, when the gate-to-source voltage is near zero, transistor 128 can handle a drain-to-source voltage of approximately 130V. On the other hand, when the gate-to-source voltage is approximately 7V, transistor 128 can only handle a drain-to-source voltage of approximately 65V. A voltage that is greater than 65V places transistor 128 in the failure area.

Thus, if transistor 128 is designed to handle, for example, 100V when the gate-to-source voltage is near zero, a grounded-gate NMOS transistor can only turn on when n+ drain region 142 reaches 100V plus a margin voltage of, for example 5V, for a total voltage of 105V. If the grounded-gate NMOS transistor turns on at any voltage less than 100V, the grounded-gate NMOS transistor will turn on during normal operation, thereby preventing transistor 128 from operating as intended.

However, since the gate-to-source voltage of transistor 128 quickly follows the voltage spike on drain region 142, the gate-to-source voltage of transistor 128 will reach 7V before the drain-to-source voltage of transistor 128 can exceed 100V. Thus, as shown in FIG. 2, transistor 128 will reach a destructive point before the grounded-gate NMOS transistor can turn on. As a result, there is a need for a circuit that allows a high-voltage driver to be ESD protected.

DETAILED DESCRIPTION OF THE INVENTION

Figure 1:
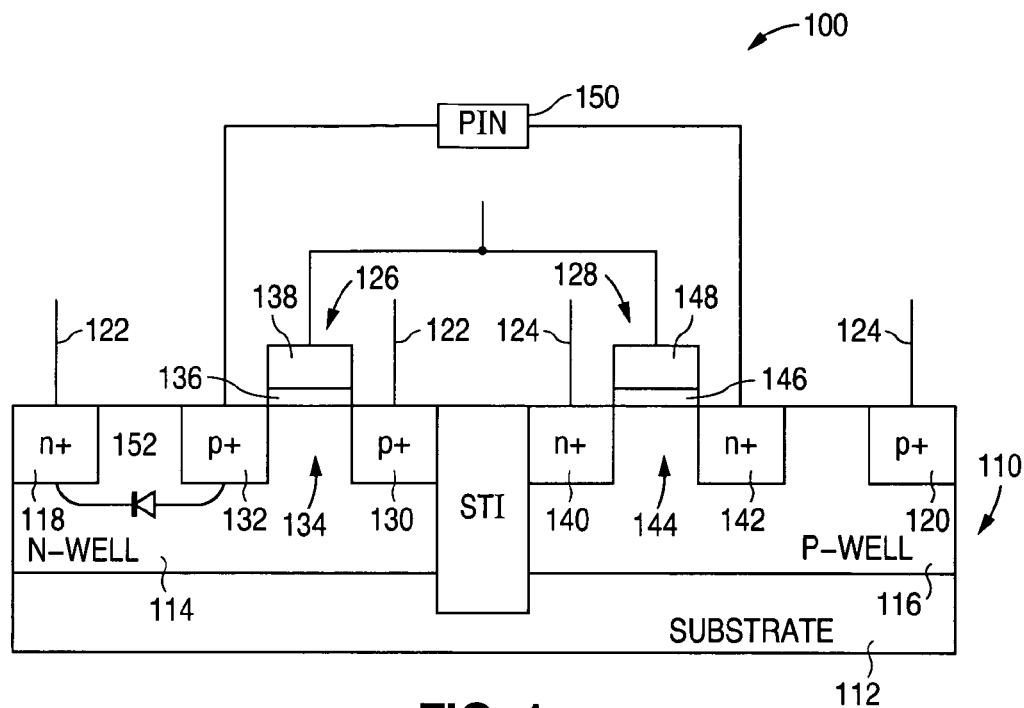
FIG. 1 is a cross-sectional diagram illustrating a prior-art high-voltage driver 100.
Figure 2:
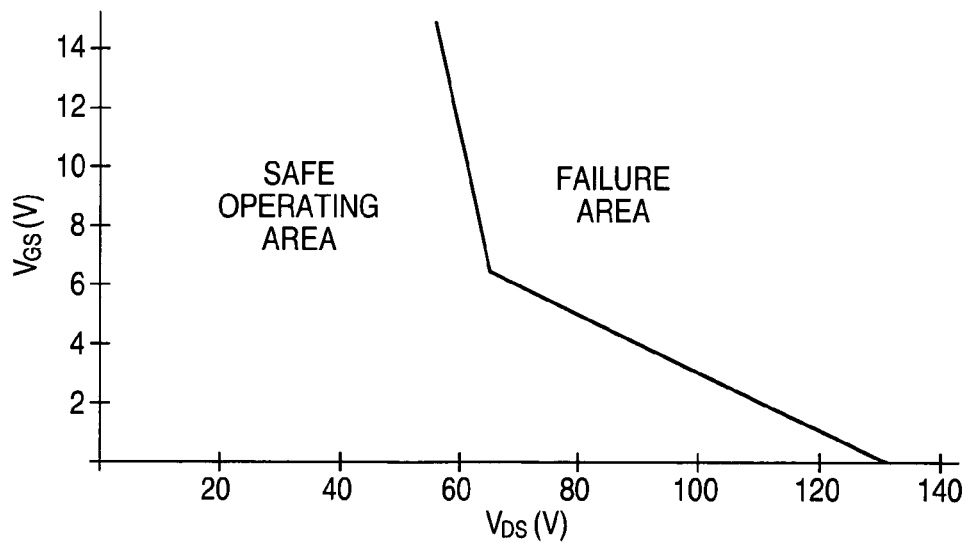
FIG. 2 is a graph illustrating an example of the safe operating area of NMOS power transistor 128.
Figure 3:
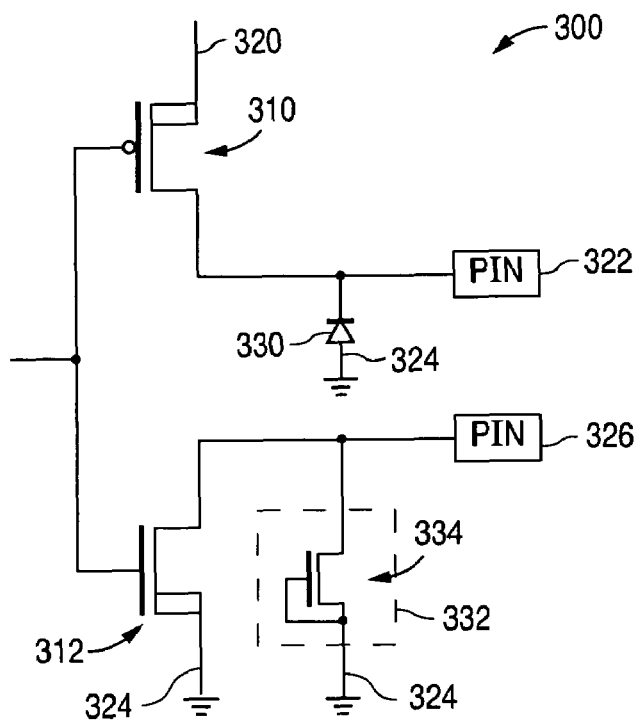
FIG. 3 is a schematic diagram illustrating an example of a high-voltage driver 300 in accordance with the present invention.

FIG. 3 shows a schematic diagram that illustrates an example of a high-voltage driver 300 in accordance with the present invention. As described in greater detail below, the driver of the present invention utilizes separate pins for the PMOS and NMOS transistors to provide ESD protection.

As shown in FIG. 3, driver 300 includes a PMOS transistor 310 and an NMOS transistor 312. PMOS transistor 310 has a p+ source region that is electrically connected to a power line 320 to place a power supply voltage on the source region, a p+ drain region that is connected to a first output pin 322, and a gate. As with PMOS transistor 126, PMOS transistor 310 is formed in an n– type semiconductor material that includes an n+ contact region connected to power line 320 to place the power supply voltage on the n-type semiconductor material.

NMOS transistor 312, in turn, has an n+ source region that is electrically connected to a ground line 324 to place ground on the source region, an n+ drain region that is connected to a second output pin 326, and a gate that is connected to the gate of PMOS transistor 310. As with NMOS transistor 128, NMOS transistor 312 is formed in a p– type semiconductor material that includes a p+ contact region connected to ground line 324 to place ground on the p-type semiconductor material.

As further shown in FIG. 3, driver 300 includes a diode 330 that is connected between first output pin 322 and ground line 324, and an ESD clamp 332 that is connected between second output pin 326 and ground line 324. ESD clamp 332 is formed to provide an open circuit between second output pin 322 and ground line 324 during normal operation, and only provide an ESD current path between second output pin 326 and ground line 324 when the voltage on second output pin 326 spikes up to a value which is greater than the maximum voltage that can be present during normal operation plus a margin voltage. As also shown in FIG. 3, ESD clamp 332 can be implemented with a grounded-gate NMOS transistor 334. Alternately, other ESD clamp circuits can also be used.

In operation, when a positive-going ESD event occurs on first output pin 322, the voltage on first output pin 322 spikes up quickly. This, in turn, causes the voltage on the drain region of PMOS transistor 310 to spike up quickly. As with PMOS transistor 126, the p+ drain region and the n-type semiconductor material/n+ contact region form a parasitic pn diode.

Since all of the other nodes of transistor 310 are at ground, the diode becomes forward biased when the voltage on the drain region reaches approximately 0.7V. As a result, the voltage on power line 320 spikes up and follows the quickly rising voltage on the p+ drain region with a magnitude that is approximately 0.7V less than the magnitude of the voltage on the p+ drain region.

When the voltage on power line 320 spikes up, the voltage on the gates of the transistors 310 and 312 is capacitively pulled up. As a result, PMOS transistor 310 turns off, while NMOS transistor 312 turns on. However, unlike driver 100, the drain of NMOS transistor 312 is not connected to the drain of PMOS transistor 310 or first output pin 322.

Thus, even though NMOS transistor 312 turns on, no current flows through NMOS transistor 312 because the voltage on second output pin 326 is equal to ground. Therefore, by utilizing first and second output pins 322 and 326 in lieu of a single output pin, NMOS transistor 312 is ESD protected from a positive-going ESD event on the drain of PMOS transistor 310.

When a negative-going ESD event occurs on first output pin 322, the voltage on first output pin 322 spikes down quickly. This, in turn, causes the voltage on the cathode of diode 330 to spike down quickly. The drop in voltage on the cathode of diode 330 forward biases diode 330, thereby providing an ESD current path to ground.

Further, when a positive-going ESD event occurs on second output pin 326, the voltage on second output pin 326 spikes up quickly. ESD clamp 332, however, turns on and provides an ESD current path to ground when the voltage on the second output pin 326 exceeds the maximum voltage that can be present during normal operation plus a margin voltage.

In addition, the first and second output pins 322 and 326 need only remain electrically spaced-apart until the first and second output pins 322 and 326 are connected to a printed circuit board. When connected to a printed circuit board, the first and second output pins 322 and 326 can be connected to a common point or trace on a printed circuit board so that the first and second output pins 322 and 326 are electrically connected together.

Figure 4:
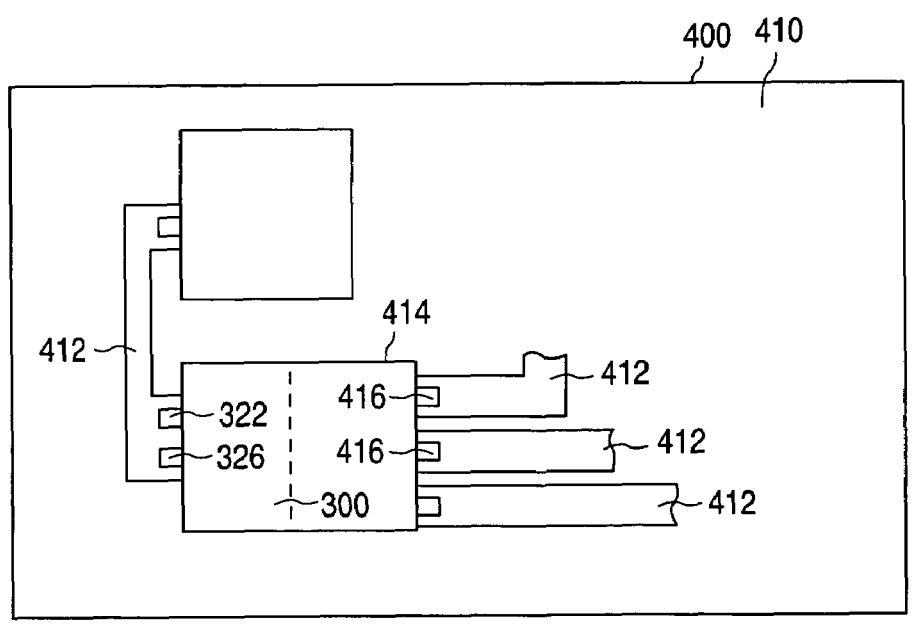
FIG. 4 is a plan view illustrating an example of a printed circuit board 400 in accordance with the present invention.

FIG. 4 shows a plan view that illustrates an example of a printed circuit board 400 in accordance with the present invention. As shown in FIG. 4, printed circuit board 400 has a top surface 410, a number of metal regions 412 that are connected to top surface 410, and a chip 414 that is connected to top surface 410. Each metal region 412 provides an electrical pathway between chip 414 and other devices that are connected to printed circuit board 400.

Chip 414, in turn, includes driver 300, and a number of additional circuits that, along with driver 300, realize a particular circuit. Chip 414 also includes pins 322 and 326 that are electrically connected to driver 300, and a number of additional pins 416 that are electrically connected to the additional circuits on chip 414.

As shown in FIG. 4, each of the pins 322, 326, and 416 is physically connected to a metal region 412, such as via solder. Pins 322 and 326, however, are physically connected to a single metal region 412, and are electrically connected together via the single metal region 412. By connecting pins 322 and 326 to a single metal region, driver 300 can operate the same as driver 100 once a chip that includes driver 300 has been installed onto a printed circuit board. Once a chip has been installed on a printed circuit board, the pins no longer require ESD protection.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor chip comprising:
   an external surface;
   a plurality of external connection points that touch the external surface, the plurality of external connection points including a first external connection point and a second external connection point, the first and second external connection points being spaced apart; and
   a driver having:
      a PMOS transistor having a source connected to a power supply line, a drain connected to the first external connection point, and a gate; and
      an NMOS transistor having a source connected to a ground line, a drain connected to the second external connection point, and a gate connected to the gate of the PMOS transistor.

2. The semiconductor chip of claim 1 wherein the drain of the PMOS transistor and the drain of the NMOS transistor are electrically isolated.

3. The semiconductor chip of claim 2 and further comprising an ESD clamp connected to the second external connection point and the ground line.

4. The semiconductor chip of claim 3 wherein the ESD clamp includes a grounded-gate NMOS transistor.

5. The semiconductor chip of claim 3 and further comprising a diode connected to the first external connection point and the ground line.

6. The semiconductor chip of claim 2 and further comprising a diode connected to the first external connection point and the ground line.

7. The semiconductor chip of claim 6 and further comprising an ESD clamp connected to the second external connection point and the ground line.

8. The semiconductor chip of claim 7 wherein the ESD clamp includes a grounded-gate NMOS transistor.

9. A electrical structure comprising:
   a semiconductor chip having:
      an external surface;
      a plurality of external connection points that touch the external surface, the plurality of external connection points including a first external connection point and a second external connection point, the first and second external connection points being spaced apart; and
      a driver having:
         a PMOS transistor having a source connected to a power supply line, a drain connected to the first external connection point, and a gate; and
         an NMOS transistor having a source connected to a ground line, a drain connected to the second external connection point, and a gate connected to the gate of the PMOS transistor; and
   a printed circuit board having:
      a top surface; and
      a number of metal regions that touch the top surface, the first and second external connection points being electrically connected to a single metal region, the drain of the NMOS transistor and the drain of the PMOS transistor being electrically connected together only by way of the single metal region.

10. The electrical structure of claim 9 and further comprising an ESD clamp connected to the second external connection point and the ground line.

11. The electrical structure of claim 10 wherein the ESD clamp includes a grounded-gate NMOS transistor.

12. The electrical structure of claim 10 and further comprising a diode connected to the first external connection point and the ground line.

13. The electrical structure of claim 9 and further comprising a diode connected to the first external connection point and the ground line.

14. The electrical structure of claim 13 and further comprising an ESD clamp connected to the second external connection point and the ground line.

15. The electrical structure of claim 14 wherein the ESD clamp includes a grounded-gate NMOS transistor.

16. A electrical structure comprising:
   a semiconductor chip having:
      an external surface;
      a plurality of external connection points that touch the external surface, the plurality of external connection points including a first external connection point and a second external connection point, the first and second external connection points being spaced apart; and
      a driver having:
         a PMOS transistor having a source connected to a power supply line, a drain connected to the first external connection point, and a gate; and
         an NMOS transistor having a source connected to a ground line, a drain connected to the second external connection point, and a gate connected to the gate of the PMOS transistor; and
   a printed circuit board having:
      a top surface; and
      a number of metal regions that touch the top surface, the number of metal regions including a first metal region and a second metal region that is isolated from the first metal region, the first and second external connection points being electrically connected to the first metal region, the drain of the NMOS transistor and the drain of the PMOS transistor being electrically connected together only by way of the first metal region.

17. The electrical structure of claim 16 wherein the plurality of external connection points includes a third external connection point, the third external connection point being electrically connected to the second metal region.

18. The electrical structure of claim 17 and further comprising an ESD clamp connected to the second external connection point and the ground line.

19. The electrical structure of claim 18 wherein the ESD clamp includes a grounded-gate NMOS transistor.

20. The electrical structure of claim 18 and further comprising a diode connected to the first external connection point and the ground line.

* * * * *